(12) United States Patent
Maas

(10) Patent No.: US 7,999,630 B2
(45) Date of Patent: Aug. 16, 2011

(54) ELECTRONIC CIRCUIT WITH AN ABSORPTIVE DISTRIBUTED LIMITING CIRCUIT

(75) Inventor: Arnoldus Petrus Maria Maas, Den Haag (NL)

(73) Assignee: Nederlandse Organisatie voor toegepast-natuurwetenschappelijk Onderzoek TNO, Delft (NL)

( * ) Notice: Subject to any disclaimer, the term of this patent is extended or adjusted under 35 U.S.C. 154(b) by 160 days.

(21) Appl. No.: 12/279,468

(22) PCT Filed: Feb. 19, 2007

(86) PCT No.: PCT/NL2007/050067
§ 371 (c)(1),
(2), (4) Date: Mar. 6, 2009

(87) PCT Pub. No.: WO2007/094671
PCT Pub. Date: Aug. 23, 2007

(65) Prior Publication Data
US 2009/0322442 A1    Dec. 31, 2009

(30) Foreign Application Priority Data
Feb. 17, 2006  (EP) .................................. 06075375

(51) Int. Cl.
*H01P 1/22* (2006.01)

(52) U.S. Cl. ...................................... 333/17.2; 327/309
(58) Field of Classification Search .................. 333/17.2, 333/81 R, 81 A; 327/309, 325
See application file for complete search history.

(56) References Cited

U.S. PATENT DOCUMENTS
2002/0180552 A1  12/2002  Bennett et al.
2006/0255879 A1  11/2006  Heston et al.

OTHER PUBLICATIONS

Smith et al., "Designing Reliable High-Power Limiter Circuits With GaAs Pin Diodes," 2002 IEEE MTT-S International Microwave Symposium Digest, (IMS 2002), Jun. 2-7, 2002 vol. 2 of 4, pp. 1245-1247.
International Search Report for PCT/NL2007/050067 dated Apr. 23, 2007.

*Primary Examiner* — Stephen E Jones
(74) *Attorney, Agent, or Firm* — Leydig, Voit & Mayer, Ltd.

(57) ABSTRACT

An electronic circuit comprising a power limiter circuit. The power limiter circuit comprises a plurality of cascaded transmission line sections, each transmission line section comprising a series arrangement of at least one diode and a dissipative element for absorbing excess input signal power connected in series. The series arrangement is connected between an output of the section and effective ground, a number of diodes connected in series in the series arrangements of the sections decreases with position of the section from an input of the power limiter to an output of the power limiter by steps of one or more diodes at least at part of the sections.

11 Claims, 3 Drawing Sheets

ELECTRONIC CIRCUIT WITH AN ABSORPTIVE DISTRIBUTED LIMITING CIRCUIT

FIELD OF THE INVENTION

The invention relates to an electronic circuit with absorptive distributed limiting circuit. The invention also relates to an amplifying circuit comprising such a limiting circuit.

BACKGROUND

US patent application No 2004/0174226 describes a power limiter circuit comprising a plurality of transmission line segments connected in succession. Each section consists of an inductor, coupled between the input and the output of the section and Schottky diodes connected anti-parallel (with mutually opposite polarity) between the output and ground. Different sections have different numbers of Schottky diodes. In the section nearest the output of the limiter circuit only two diodes are connected between the output of the section and ground, each in a respective polarity direction. In transmission line sections successively further upstream series connections of successively more diodes are connected between output of the section and ground.

In operation the Schottky diodes limit the power delivered to the output of the limiting circuit when a large power signal is input to the limiting circuit. In the case of a small power input signal the limiting circuit operates as a transmission line that passes the input signal to its output with a delay, without affecting the power.

US patent application No 2004/0174226 distinguishes from a prior limiter circuit with a resistor between its input and output and diodes connected anti-parallel between the output and ground. Such a circuit was said to be unsuitable for high frequencies due to distortion and losses.

By using a succession of sections the limiting function is distributed among all the diodes and by using increasingly more series connected diodes in the stages near the input of the limiting circuit it is avoided that the diodes received voltages greater than the limit imposed by semi-conductor manufacturing processes.

The circuit of US patent application No 2004/0174226 has the effect of reflecting the input signal when the power of the input signal is large. The circuit is provided with a circulator at the input of the limiter. The circulator directs the reflected power to the output of a power amplifier, where it is absorbed. This can be problematic at larger power levels. More generally, the need to handle reflections of large power input signals presents problems.

U.S. Pat. No. 3,568,099 describes a microwave limiter circuit wherein the problem of reflection during limiting operation is addressed. This circuit comprises a quarter wavelength transmission line section connected between its input and output, with a limiting diode connected between the output of the transmission line section and ground and a series connection of a limiting diode and a resistor connected between the input of the transmission line section and ground. The impedance of the resistor matches the impedance of the transmission line.

In operation, when the limiter circuit of U.S. Pat. No. 3,568,099 receives small signals, neither of the diodes in conductive, with the result that the circuit functions as a conventional transmission line section. When a large signal is applied, the diode at the output functions as a short circuit, which appears at the input as an open circuit, because the length of transmission line section is a quarter wavelength.

The series connection of the diode and the resistor at the input of the transmission line determines the impedance of the limiter circuit for large signals: this is the matched impedance of the resistor, so that no signal is reflected.

The limiter circuit of U.S. Pat. No. 3,568,099 has the problem that the diodes can break down for large signals. If large diodes to counteract this problem, the increased capacitance of such diodes deteriorate matching, so that more power is reflected.

Limiters can be used for example in a phase-array radar system. In this case limiters are used to protect the sensitive input of the low-noise amplifiers (LNA) of T/R-modules inside the phase-array radar system. In phase-array radar system a circulator may be provided to direct transmission signals from a power amplifier to the antenna and not the low-noise amplifier and to direct received signals from the antenna to the low-noise amplifier and not to the power amplifier. Herein it can be problematic to reflect high input power levels from the low noise amplifier back through the circulator and to the power amplifier. This problem can be solved by routing the reflected signal to a high-power load by adding an extra circulator. This effectively creates an absorptive limiter but results in a bulky and costly design.

SUMMARY

Among others it is an object to provide for a limiting circuit wherein reflections are reduced.

A reduction of reflection makes it possible to realize the limiting circuit as a low-cost and small-sized circuit.

Among others it is an alternative object to reduce component stress at high input power and capacitive loss in diodes.

A circuit according to claim 1 is provided. Distributed absorption of excess power in dissipative elements such as resistors is made possible by providing the dissipative elements in series with series arrangements of diodes with decreasing numbers of diodes at successive positions along a transmission line. Preferably, resistive component values of the dissipative elements are selected so that the resulting composite impedance at the input approximates the characteristic impedance of the transmission line at least in an operational frequency range and for high input power levels.

In an embodiment a final section is used with diodes but without resistors in series with the diodes, in order to provide for absolute limiting. In an embodiment the resistive component values of the dissipative elements decrease with position along the transmission line.

In an embodiment the resistive component values of the dissipative elements are configured to equalize the currents in the diodes. This maximizes power handling capability.

BRIEF DESCRIPTION OF THE DRAWINGS

These and other objects and advantages will become apparent from the following description of exemplary embodiments using the following figures.

DETAILED DESCRIPTION

Figure 1:
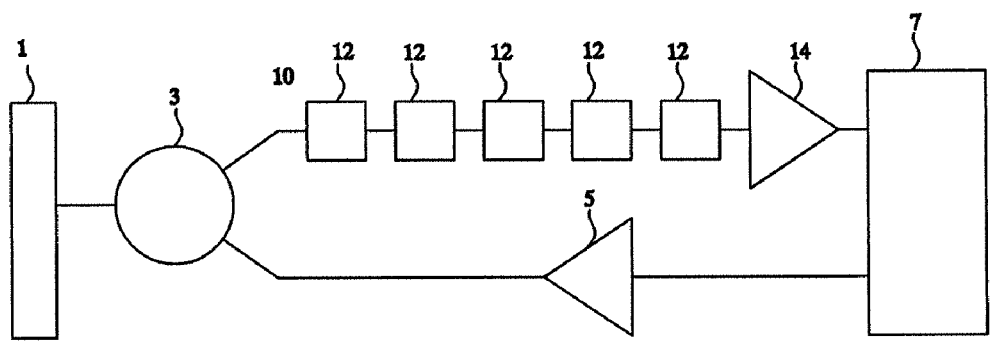
FIG. 1 shows a high frequency electronic circuit

FIG. 1 shows an electronic circuit comprising an antenna 1, a circulator 3, a power amplifier 5 and processing circuits 7. Furthermore the circuit comprises a reception circuit part comprising an input 10, a cascade of transmission line stages 12 and an amplifier 14. An output of circulator 3 is coupled to the input 10 of the reception circuit part. An input of the cascade is coupled to input 10 and an output of the cascade is coupled to an input of amplifier 14.

Figure 2:
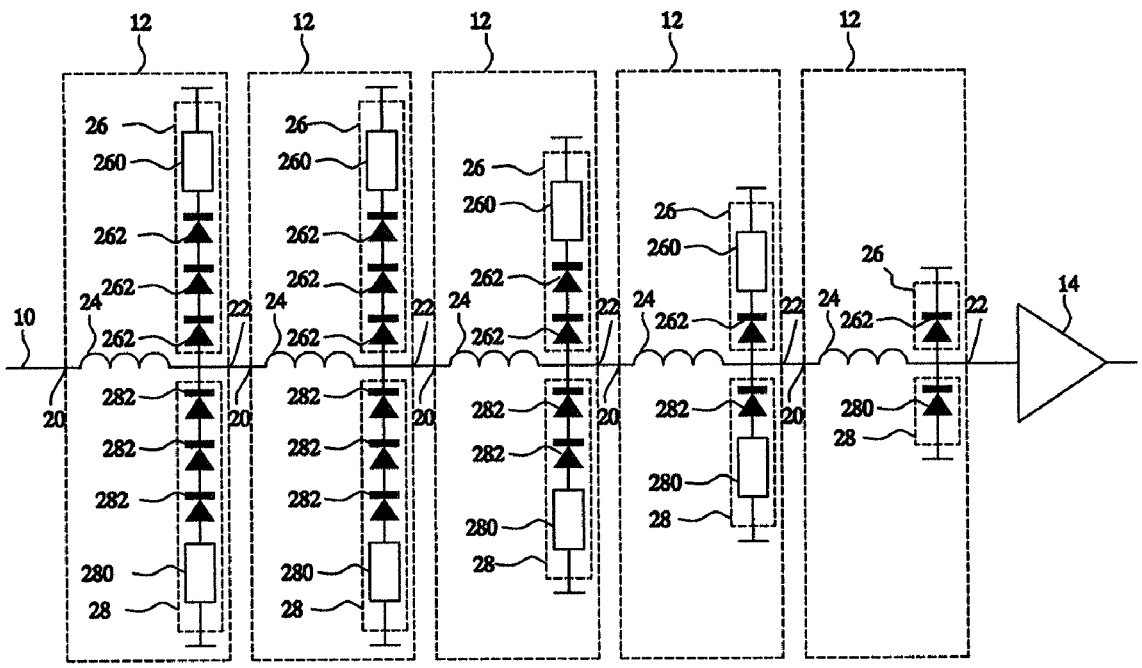
FIG. 2 shows a limiter circuit.

FIG. 2 shows the transmission line stages 12 in more detail. Each stage comprises an input 20, an output 22, an inductance 24 coupled between the input 20 and the output 22 and a pair of series arrangements 26, 28 coupled between the output 22 and ground. In all bit the last stage, each series arrangement 26, 28 comprises a resistor 260, 280 in series with a diode 262, 282 or a series connection 26, 28 of diodes 262, 282 connected with the same polarity in series. The connection polarity of the diodes in the series arrangements 26, 28 are mutually opposite. In the last stage (nearest the output) the series arrangements 26a, 26b contain only diodes 262, 282 and no resistors.

The number of diodes 262, 282 in the stages decreases as a function of position of the stage between the input 10 and amplifier 14, at least at some of the positions and at other positions the number of diodes remains the same. Thus, the number of diodes does not increase as a function of position. By way of example an embodiment is shown wherein the first and second stage 12 from the input 10 have a series connection 26, 28 consisting of three diodes 262, 282, the third stage 12 from the input 10 has a series connection 26, 28 consisting of two diodes and the fourth stage 12 from the input 10 has a two diodes 262, 282 connected anti-parallel. Within each stage 12, the series arrangements 26, 28 contain the same number of diodes.

In an embodiment diodes Schottky diodes are used, which operate as current controlled switches. The advantage of using Schottky diodes is that there is virtually no delay in the response of the limiter. High-power RF pulsed sources will be limited just as well as CW sources. In an embodiment the limiter circuit may be realized in MMIC technology. In a further embodiment the PPH25x process from United Monolithic Semiconductors (UMS) may be used. This is basically a process meant to be used for high-power amplifiers although the limiter circuit does not use any active devices.

In operation the circuit operates as a normal transmission line for low power signals. The inductance of the inductors and the low signal capacitance behavior of the diodes simulates transmission line behavior. Thus, for low input power levels the signal is routed to the output of the limiter circuit.

For high input power the final stage reflects all power to protect the amplifier behind the limiter circuit. The other stages route the signal to distribute the power over the load resistors 260, 280 of the different stages. The diodes switch the excess input power to the on-chip high-power load resistors 260, 280. The circuit forms a special arrangement that allows the limiter circuit to absorb most or all of the applied input power.

For high power signals the last stage acts as a short circuit with a reflection coefficient of minus one. The other stages each partially absorb, reflect and transmit large signals because of the resistors. The effective reflection coefficient at input 10 is due to a compound effect of the successive stages. The resistance values of the stages are selected so that substantially no effective reflection occurs at input 10 at least for a predetermined power level and a predetermined frequency, or approximately over a range of power levels and/or frequencies. Resistance values needed for this effect can be selected by simulation and fitting techniques to select resistance values to approximate the required reflection coefficient. Due to the non-linear effects of the diodes analytical expressions for the compound impedance are hard to derive. By way of example the resistance values may be selected so that at sufficiently high power to switch on the diodes load resistors 260, 280 absorb at least half the incoming power and preferably at least ninety percent.

Figure 3:
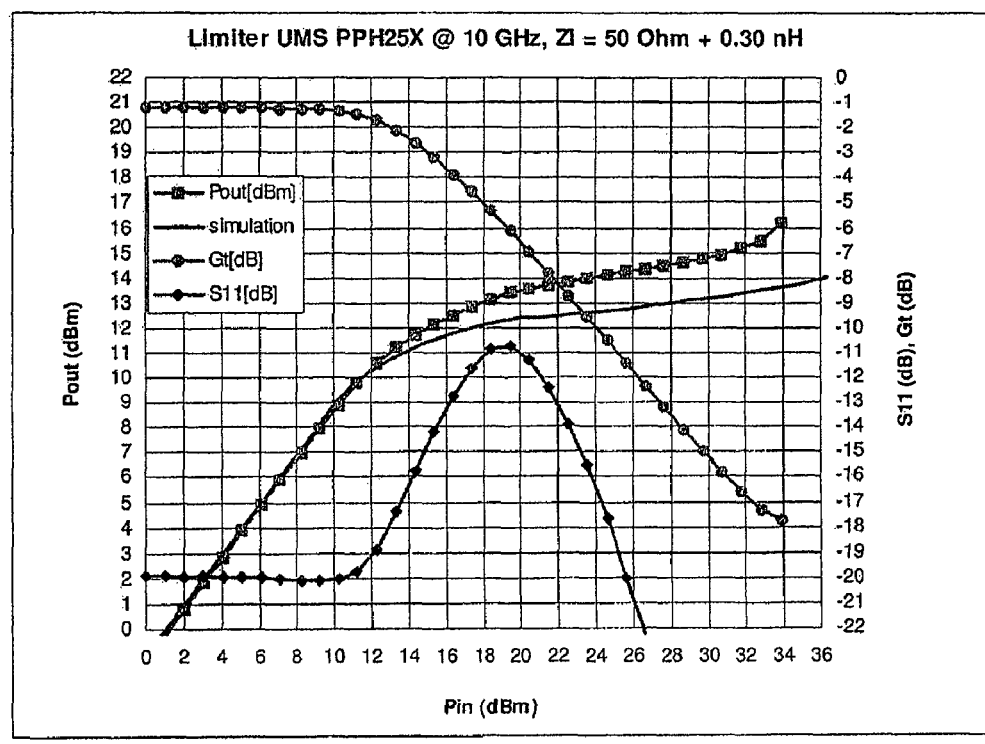
FIG. 3 shows a graph of limiter input reflection and output power versus input power.

FIG. 3 shows a diagram with limiter input reflection and output power versus input power at 10 GHz for a 3 Watt X-band distributed absorptive limiter GaAs MMIC. The measured performance shows the potential for this design. For low powers the output power increases linearly with input power up to about 15 dBm, for higher input power the output power levels of. The reflection coefficient is not zero due to unavoidable mismatch errors, but it can be seen that the reflection coefficient does not rise above −10 dB (ten percent reflected power). Both small-signal and high-power measurements were carried out on the limiter.

Measurements and simulations of basic performance are shown in FIG. 3. Agilent's ADS, Momentum and Orcad's PSPICE were using to simulate the performance of the limiter. Foundry-supplied ADS models for the diodes, inductors and resistors were used. The measurement were close to the (shown) simulated performance, even though the foundry models used were not verified for these extremely high current and voltage levels.

In an example wherein the characteristic impedance of the transmission line is fifty Ohms, resistance values of about sixty Ohm, fifteen Ohm, seven point five Ohm and three and three quarter Ohms are used in the stages successively from the input 10. As may be noted the resistance decreases. This is because the transmission line stages are less than a quarter wavelength long, so that the effective impedance at the input 10 due to stages further down the transmission line increases due to the effect of the transmission line. In the example the resistances generally increase by a factor of two, except between the first and second stage. This exception corresponds to the fact that the same number of diodes is used in these stages. However, it should be appreciated that these resistance values are only an approximate example. Other resistor values may be used with the same or improved effect.

Preferably transmission line of the limiter circuit has an effective length of no more than a quarter wavelength at an operating frequency of the circuit. Greater lengths are not needed, and would needlessly increase the size of the circuit. However the circuit need not be exactly a quarter wavelength. Shorter circuits may also be used, because there is no need to transform the short circuit at the output to a full open circuit.

Another application may be to keep the diode currents below the maximum value allowed for the diodes and resistors. Because both the load resistors and the limiting function itself has been split up into several branches a distributed circuit results in which the acceptable maximum input power is maximized. Using this technique, the combination of maximum attenuation and maximum input power capability for the selected process is possible. By selecting the resistance values of the resistors 260, 280 to balance (equalize) the peak diode currents of all of the series connections of diodes 262, 282 (diode fingers) at maximum input power level, maximum use of the available power handling is achieved. Therefore, preferably the resistor values provide for substantially equal non-zero signal current values at least one input power level. As used herein substantially equal currents means that the currents differ less than ten percent.

It may be noted that equalizing the currents has the effect that the power dissipated by the resistors in the different stages differs, when the resistance values of the resistors 260, 280 of different stages differ.

Figure 4:
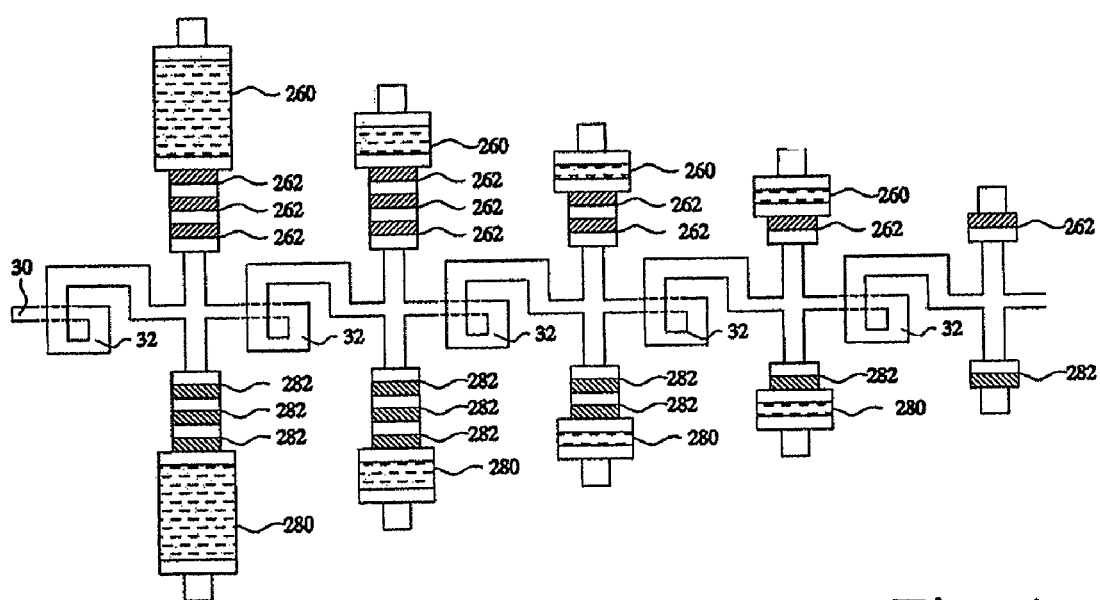
FIG. 4 shows a layout of a limiter circuit.

FIG. 4 shows a layout of the limiter. In an embodiment the total circuit measured about 1.4×2.0 mm². In the layout an input pad 30 forms input 10. The inductors are formed by spiral conductor patterns 32 which contain vias to connect successive stages. In each stage except the last stage, series connections 26, 28 of diodes 262, 282 and resistors 260, 280 are provided. In the last stage, single diodes 262, 282 are provided. Resistors 260, 280 are connected between the diodes 262, 282 and further vias that are connected to ground.

Matching of the ports of the limiter has been achieved by making use of the parasitic capacitance of the diodes in combination with on-chip inductors. The circuit corresponds to the lumped-element equivalent schematic of FIG. 2.

When an absorptive limiter is realized using MMIC technology, a low-cost and small-sized circuit becomes possible as well as the integration with the LNA on a single chip. When the absorptive limiter achieves losses comparable to those of the combination of a ferrite isolator and a reflective limiter, there will be no degradation of the system noise floor.

Although specific embodiments have been shown, it should be appreciated that the invention is not limited to these embodiments. For example, it should be appreciated that more or fewer stages with diodes may be used. Also it should be appreciated that stages with true transmission lines may be used instead of simulated transmission lines using inductors and the capacitive effect of the diodes.

As another example, instead of two parallel series arrangements of on or more diodes and a resistor, each stage may comprise one series arrangement of an anti-parallel connection of diodes and a resistor. However, the use of two series arrangement of one or more diodes and a resistor, each series arrangement for one polarity of the diodes has the advantage that independent biasing is possible and it may decrease capacitive loads for low power signals. Also instead of a single pair of series arrangements 26, 28 in each stage or in part of the stages a plurality of such pairs of series arrangements may be used in parallel. In particular, more diodes may be used in parallel in the stage nearest the input than in stages further from the input, or increasingly fewer diodes may be used in parallel in respective stage, as the respective stages are further from the input. Use of more diodes in parallel in the stage or stages nearest the input has the advantage that a larger power can be handled. At the same time the use of a larger number of diodes in series in this stage or theses stages, as shown in FIG. 2, ensures that the larger number of diodes in parallel does not lead to a corresponding increase in capacitance. The use of a larger number of diodes at a stage or stages near the input may also increase the ability to handle larger power near the input, even without diodes in parallel, by more evenly distributing power dissipation over different diodes. The last stage (without resistors) may be omitted when no absolute limiting of the input signals is needed, but preferably such a last stage is used because it ensures a predetermined limit to the output signal of the limiting circuit.

As another example, it should be appreciated that the series arrangements may contain the resistors and the diodes in any sequence. Instead of Schottky diodes other diodes may be used. Instead of individual diodes, groups of diodes connected in parallel may be used, and instead of resistors groups of resistors connected in parallel may be used, or other devices with resistive circuit behavior. Other components may be added. Instead of inductors to true transmission line sections may be used. Although simple ground connections have been shown, it will be appreciated that effective ground connections may be used that carry DC voltages, for example in order to bias the diodes.

The invention claimed is:

1. An electronic circuit comprising a power limiter circuit, the power limiter circuit comprising a plurality of cascaded transmission line sections, each transmission line section comprising a series arrangement of at least one diode and a dissipative element for absorbing excess input signal power connected in series, wherein the series arrangement is connected between an output of the transmission line section and an effective ground, and wherein a number of diodes connected in series in the series arrangement of the transmission line sections decreases with position of the transmission line section from an input of the power limiter to an output of the power limiter by steps of one or more diodes for at least two sections of the cascaded transmission line sections.

2. An electronic circuit according to claim 1, wherein the dissipative elements have impedance values for resistive components' values that decrease with position of the transmission line sections in relation to an input of the power limiter circuit, as the transmission line section is further from the input of the power limiter circuit.

3. An electronic circuit according to claim 1, wherein the dissipative elements have impedance values selected so that each one of the series arrangements draws a substantially equal non-zero signal current at least at one power level.

4. An electronic circuit according to claim 1, wherein the dissipative elements are resistors.

5. An electronic circuit according to claim 1, further comprising a final transmission line section coupled between the plurality of cascaded transmission line sections and an output of the limiter circuit, the final transmission line section comprising a series arrangement consisting of one or more diodes connected directly between an output of the final section and effective ground.

6. An electronic circuit according to claim 1, wherein each cascaded transmission line section comprises a further series arrangement of at least one further diode and a further dissipative element connected in series, the further series arrangement being connected between the output of the section and effective ground, a further number of diodes connected in series in the further series arrangement and the number of diodes in the series arrangement in each transmission line section being mutually equal.

7. An electronic circuit according to claim 1, further comprising an amplifier with an input coupled to the plurality of cascaded transmission line sections.

8. An electronic circuit according to claim 1, wherein the dissipative elements have impedance values with resistive component values selected to absorb at least half an input power of an input signal of the power limiter circuit distributed over the series arrangements of the transmission line sections during operation at least at one power level of the input power.

9. An electronic circuit according to claim 8, wherein the resistive components' values are selected to absorb at least nine tenths of the input power of the input signal of the limiter circuit in the dissipative elements during operation, in an operational power level range of the input power.

10. An input power limiter, having a plurality of cascaded sections, wherein each section comprises a transmission line, a pair of switching elements, a pair of dissipative elements, whereby the transmission line is at one end connected to a circuit input and at an opposite end connected to a circuit output, and wherein the opposite end of the transmission line is connected to the pair of switching elements, whereby each switching element is connected to circuit ground by one of the pair of dissipative elements, and whereby each switching element is connected in anti-parallel position.

11. A method of limiting power transmitted between an input and an output, the method comprising:

passing a signal through a plurality of cascaded transmission line sections from the input to the output;

providing, in each section of the cascaded transmission line sections, a series arrangement of at least one diode and a dissipative element connected in a series between an output of the section and an effective ground;

passing power from the signal to the dissipative elements distributed over different sections of the cascaded transmission line sections when a power of the signal rises above a threshold level determined by the diodes within the series arrangements of the cascaded transmission line sections; and absorbing at least half the power from the signal in the dissipative elements of the cascaded transmission line sections when the signal is above the threshold level.

* * * * *